United States Patent
Eum et al.

(10) Patent No.: US 12,055,866 B2
(45) Date of Patent: Aug. 6, 2024

(54) CLEANING JIG, SUBSTRATE TREATING APPARATUS INCLUDING THE SAME, CLEANING METHOD OF SUBSTRATE TREATING APPARATUS

(71) Applicant: SEMES CO., LTD., Cheonan-si (KR)

(72) Inventors: Kisang Eum, Cheonan-si (KR); Chang Suk Oh, Cheonan-si (KR); Sang Eun Noh, Pohang-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 414 days.

(21) Appl. No.: 17/465,293

(22) Filed: Sep. 2, 2021

(65) Prior Publication Data
US 2022/0075280 A1    Mar. 10, 2022

(30) Foreign Application Priority Data

Sep. 10, 2020   (KR) ........................ 10-2020-0116377

(51) Int. Cl.
| | | |
|---|---|---|
| *B08B 13/00* | (2006.01) | |
| *B08B 9/093* | (2006.01) | |
| *G03F 7/00* | (2006.01) | |

(52) U.S. Cl.
CPC ........ *G03F 7/70925* (2013.01); *B08B 9/0936* (2013.01); *B08B 13/00* (2013.01); *B08B 2209/08* (2013.01)

(58) Field of Classification Search
CPC ... G03F 7/70925; B08B 9/0936; B08B 13/00; B08B 2209/08
USPC ...................................................... 134/58 R
See application file for complete search history.

(56) References Cited

FOREIGN PATENT DOCUMENTS

| | | |
|---|---|---|
| JP | 2003-024863 A | 1/2003 |
| JP | 2009-187996 A | 8/2009 |
| JP | 2012-156497 A | 8/2012 |
| JP | 2015-046457 A | 3/2015 |
| JP | 2015-046461 A | 3/2015 |
| JP | 2015-050326 A | 3/2015 |
| JP | 2015-050408 A | 3/2015 |
| JP | 5898586 B2 | 4/2016 |
| KR | 101223354 B1 | 1/2013 |
| KR | 10-2015-0049184 A | 5/2015 |
| KR | 101521302 B1 | 5/2015 |

(Continued)

OTHER PUBLICATIONS

KR20200040380A—machine translation (Year: 2020).*

(Continued)

*Primary Examiner* — Tinsae B Ayalew
(74) *Attorney, Agent, or Firm* — Harness, Dickey & Pierce, P.L.C.

(57) ABSTRACT

The inventive concept relates to a substrate treating apparatus, and may include a substrate treating apparatus includes a rotatable spin head, a cup that surrounds the spin head, a cleaning jig seated on the spin head, and that discharges a cleaning liquid toward the cup through rotation of the spin head, and a nozzle unit located at an upper portion of the cleaning jig and that supplies the cleaning liquid to a center of an upper surface of the cleaning jig, and the cleaning jig includes spattering guide grooves formed to be recessed such that the cleaning liquid provided from the nozzle unit spatters toward the cup with a centrifugal force due to the rotation of the spin head.

17 Claims, 11 Drawing Sheets

(56) References Cited

FOREIGN PATENT DOCUMENTS

| KR | 101882033 B1 | 7/2018 |
| KR | 101980508 B1 | 5/2019 |
| KR | 10-2020-0021680 A | 3/2020 |
| KR | 102119685 B1 | 6/2020 |
| KR | 102143914 B1 | 8/2020 |

OTHER PUBLICATIONS

KR20150049184A—machine translation (Year: 2015).*
KR20200021680A—machine translation (Year: 2020).*
Korean Office Action dated Oct. 21, 2022 issued in corresponding Korean Appln. No. 10-2020-0116377.
Notice of Allowance, dated Jun. 23, 2023, issued in corresponding Korean Patent Application No. 10-2020-0116377.
Japanese Office Action dated Sep. 20, 2022 issued in corresponding Japanese Appln. No. 2021-145322.

* cited by examiner

CLEANING JIG, SUBSTRATE TREATING APPARATUS INCLUDING THE SAME, CLEANING METHOD OF SUBSTRATE TREATING APPARATUS

CROSS-REFERENCE TO RELATED APPLICATIONS

A claim for priority under 35 U.S.C. § 119 is made to Korean Patent Application No. 10-2020-0116377 filed on Sep. 10, 2020, in the Korean Intellectual Property Office, the entire contents of which are hereby incorporated by reference.

BACKGROUND

Embodiments of the inventive concept described herein relate to a substrate treating apparatus, and more particularly, to a substrate treating apparatus that may clean a cup provided in a liquid treating unit.

Various processes such as cleaning, deposition, photographing, etching, and ion implantation are performed to manufacture a semiconductor device. Among the processes, in the photographing process, application, exposure, and development steps are sequentially performed. The application process is a process of applying a photosensitive liquid such as a resist onto a surface of a substrate. The exposure process is a process of exposing a circuit pattern on a substrate in which a photosensitive film is formed. The development process is a process of selectively developing an exposed area of a substrate.

Generally, an application process and a development process are processes for liquid-treatment, and a process of supplying a treatment liquid onto a substrate is performed. The liquid-treatment process for the substrate is performed in a treatment container, and the used treatment liquid is recovered through the treatment container.

Because various treatment liquids are recovered through the treatment container according to the processes, the treatment liquids are stuck to the treatment container. The treatment liquid stuck to the treatment container acts as fumes later, or becomes a main cause of contaminating the substrate.

FIG. 1 illustrates a liquid treating unit.

Referring to FIG. 1, the liquid treating unit 1 includes a cup 2 that provides a substrate treating process, a support plate 4, on which a substrate is positioned, in an interior of the cup 2, and a nozzle unit 5 that is located above the support plate 4 to discharge a treatment liquid toward the substrate 3.

The treatment liquid supplied to the substrate is recovered through the cup 2. Because various treatment liquids are recovered through the cup 2 according to processes, the treatment liquids are stuck to the cup 2. The treatment liquid 6 stuck to the cup 2 acts as fumes later or may spatters to the substrate again.

Accordingly, it is preferable that the cup 2 is cleaned periodically or is cleaned before the substrate is treated with another kind of treatment liquid.

Conventionally, a disk-shaped cleaning jig is used. It is difficult to uniformly clean to-be-cleaned objects distributed at various heights in an interior of the cup 2 in a state, in which a relative height between the cup 2 and the cleaning jig is fixed.

SUMMARY

Embodiments of the inventive concept provide a cleaning jig that may efficiently clean a cup, a substrate treating apparatus having the same, and a method for cleaning a substrate treating apparatus.

Embodiments of the inventive concept also provide a cleaning jig that may clean cups at various heights, a substrate treating apparatus having the same, and a method for cleaning a substrate treating apparatus.

Embodiments of the inventive concept also provide a cleaning jig that may easily utilize a space, and a substrate treating apparatus having the same.

The aspect of the inventive concept is not limited thereto, and other unmentioned aspects of the present invention may be clearly appreciated by those skilled in the art from the following descriptions.

According to an aspect of the inventive concept, a substrate treating apparatus includes a rotatable spin head, a cup that surrounds the spin head, a cleaning jig seated on the spin head, and that discharges a cleaning liquid toward the cup through rotation of the spin head, and a nozzle unit located at an upper portion of the cleaning jig and that supplies the cleaning liquid to a center of an upper surface of the cleaning jig, and the cleaning jig includes spattering guide grooves formed to be recessed such that the cleaning liquid provided from the nozzle unit spatters toward the cup with a centrifugal force due to the rotation of the spin head.

Furthermore, the spattering guide grooves may be formed to be curved from the center of the cleaning jig along a circumferential direction of the cleaning jig.

Furthermore, curves of the spattering guide grooves may be curved in a direction corresponding to a flow direction of the cleaning liquid in the cleaning jig.

Furthermore, curves of the spattering guide grooves may be curved in a direction that is opposite to a flow direction of the cleaning liquid in the cleaning jig.

Furthermore, the spattering guide grooves may be formed on concentric circles that are distant from the center of the cleaning jig by a specific distance at an equal interval.

Furthermore, each of the spattering guide grooves may be configured such that an inclination of a first bottom surface thereof that faces an outside of the cleaning jig with reference to a bottom point of a bottom surface thereof, a height of which is lowest, is gentler than an inclination of a second bottom surface thereof that faces an inside of the cleaning jig.

Furthermore, each of the spattering guide grooves may be configured such that a first bottom surface thereof in a direction, in which the cleaning liquid spatters, with reference to a bottom point of a bottom surface thereof, a height of which is lowest, is gentler than an inclination of a second bottom surface in an opposite direction.

Furthermore, the inclinations of the first bottom surfaces of the spattering guide grooves may be different.

Furthermore, the substrate treating apparatus may further include a supply unit that supplies the cleaning liquid to the nozzle unit, and a controller that controls the supply unit such that an amount of the cleaning liquid supplied to the cleaning jig increases and decreases at a specific cycle.

Furthermore, the controller may control the spin head such that a rotational speed of the spin head is repeatedly accelerated and decelerated while the cleaning liquid is supplied to the cleaning jig.

Furthermore, the substrate treating apparatus may further include a back nozzle that ejects the cleaning liquid to a bottom surface of the cleaning jig, and the cleaning jig may further include a spattering guide boss protruding downwards from a bottom surface of an edge thereof.

According to another aspect of the inventive concept, a cleaning jig includes a jig body of a circular plate shape having a specific thickness, the jig body includes a central area, to which a cleaning liquid is supplied from a nozzle unit, and an edge area surrounding the central area, and the spattering guide grooves formed in the edge area to be recessed such the cleaning liquid spatters with a centrifugal force due to rotation of the spin head.

Furthermore, the spattering guide grooves may include the spattering guide grooves of a first group, which are arranged along a first concentric circle of the jig body, and the spattering guide grooves of a second group, which are arranged along a second concentric circle that is larger than the first concentric circle.

Furthermore, lengths of the spattering guide grooves of the first group may be different from lengths of the spattering guide grooves of the second group.

Furthermore, the spattering guide grooves may be formed to be curved from the center of the cleaning jig along a circumferential direction of the cleaning jig.

Furthermore, the spattering guide grooves may be formed on concentric circles that are distant from the center of the jig body by a specific distance.

Furthermore, each of the spattering guide grooves may be configured such that an inclination of a first bottom surface thereof that faces an outside of the cleaning jig with reference to a bottom point of a bottom surface thereof, a height of which is lowest, is gentler than an inclination of a second bottom surface thereof that faces an inside of the cleaning jig.

Furthermore, each of the spattering guide grooves may be configured such that a first bottom surface thereof in a direction, in which the cleaning liquid spatters, with reference to a bottom point of a bottom surface thereof, a height of which is lowest, is gentler than an inclination of a second bottom surface in an opposite direction.

Furthermore, the cleaning jig may further include a spattering guide boss protruding downwards from a bottom surface of an edge thereof.

According to another aspect of the inventive concept, a method for cleaning a cup with a substrate treating apparatus includes seating a cleaning jig on a spin head, rotating the spin head, and supplying a cleaning liquid to an upper surface of the cleaning jig that rotates such that the cleaning liquid spatters along the spattering guide grooves formed on an upper surface of the cleaning jig, an amount of the cleaning liquid supplied to the cleaning jig increases and decreases at a specific cycle, and a rotational speed of the spin head is repeatedly accelerated and decelerated while the cleaning liquid is supplied to the cleaning jig.

Furthermore, a rotational speed of the spin head is repeatedly accelerated and decelerated while the cleaning liquid is supplied to the cleaning jig.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, exemplary embodiments of the inventive concept will be described in more detail with reference to the accompanying drawings. The embodiments of the inventive may be modified in various forms, and the scope of the inventive concept should not be construed to be limited to the following embodiments. The embodiments of the inventive concept are provided to describe the present inventive for an ordinary person skilled in the art more completely. Accordingly, the shapes of the components of the drawings are exaggerated or reduced to emphasize clearer description thereof.

The system of the present embodiment of the present invention may be used to perform a photography process on a substrate such as a semiconductor substrate or a flat display panel. In particular, the system of the present embodiment may be connected to an exposure apparatus to perform an application process and a development process on a substrate. Hereinafter, a case of using a substrate as a substrate may be described as an example.

Hereinafter, a substrate treating system of the inventive concept will be described with reference to FIGS. 2 to 16.

Figure 1:
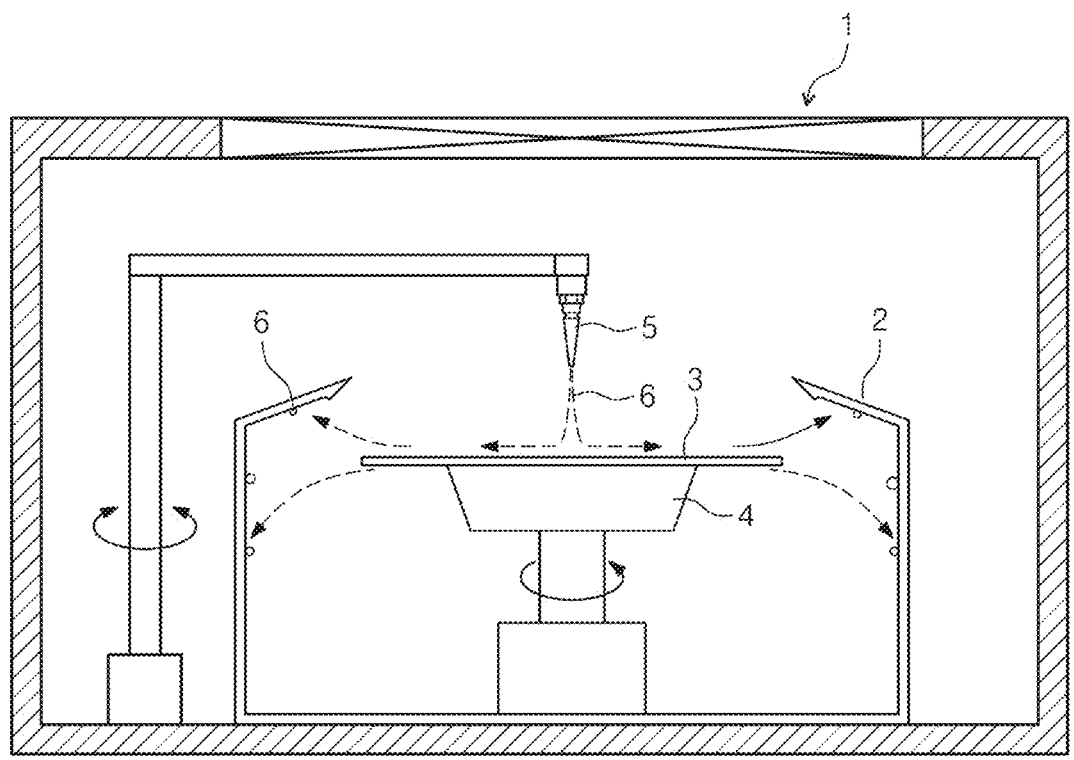
FIG. 1 is a cross-sectional view illustrating a general liquid treatment unit.
Figure 2:
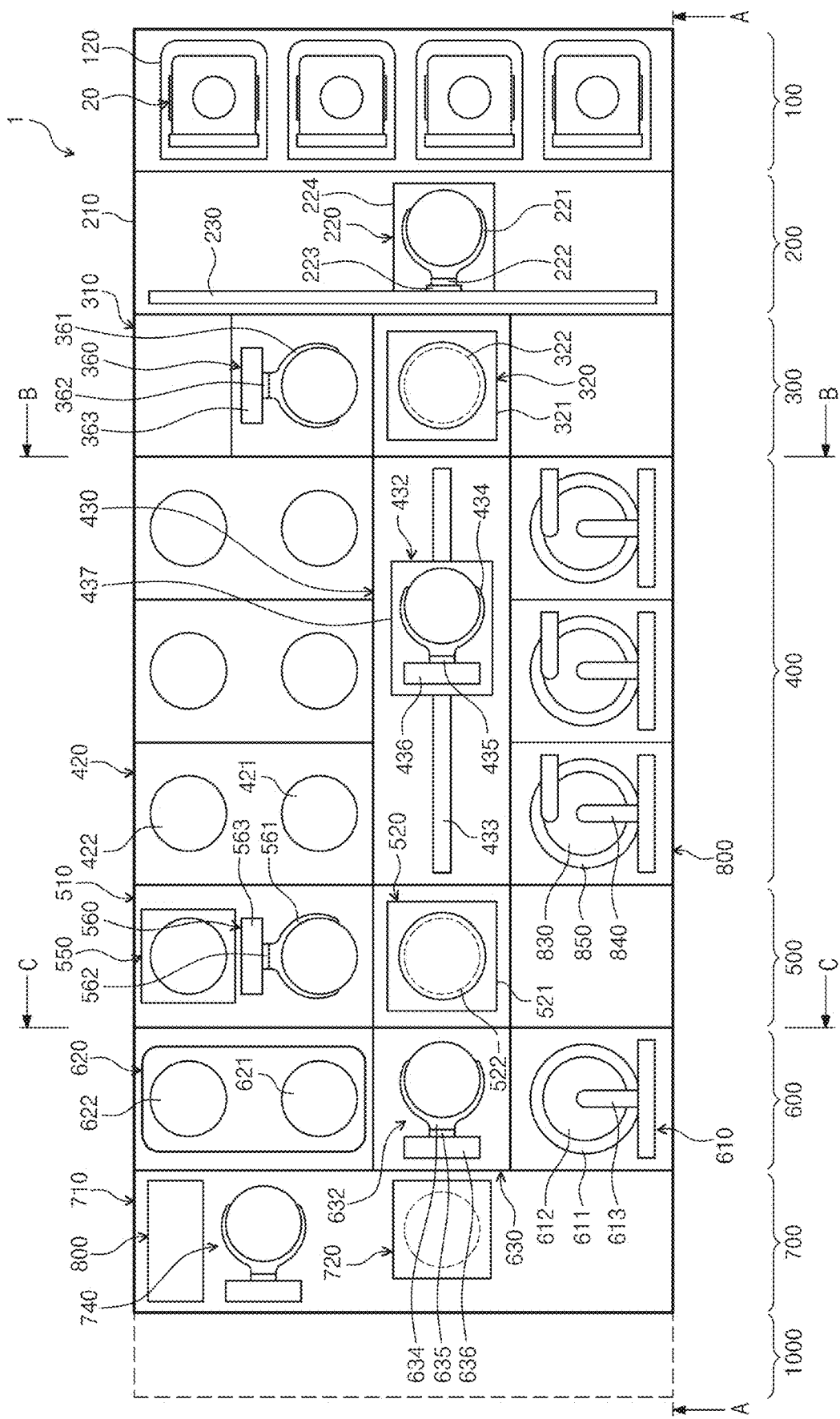
FIG. 2 is a plan view of a substrate treating system according to a first embodiment of the inventive concept.
Figure 3:
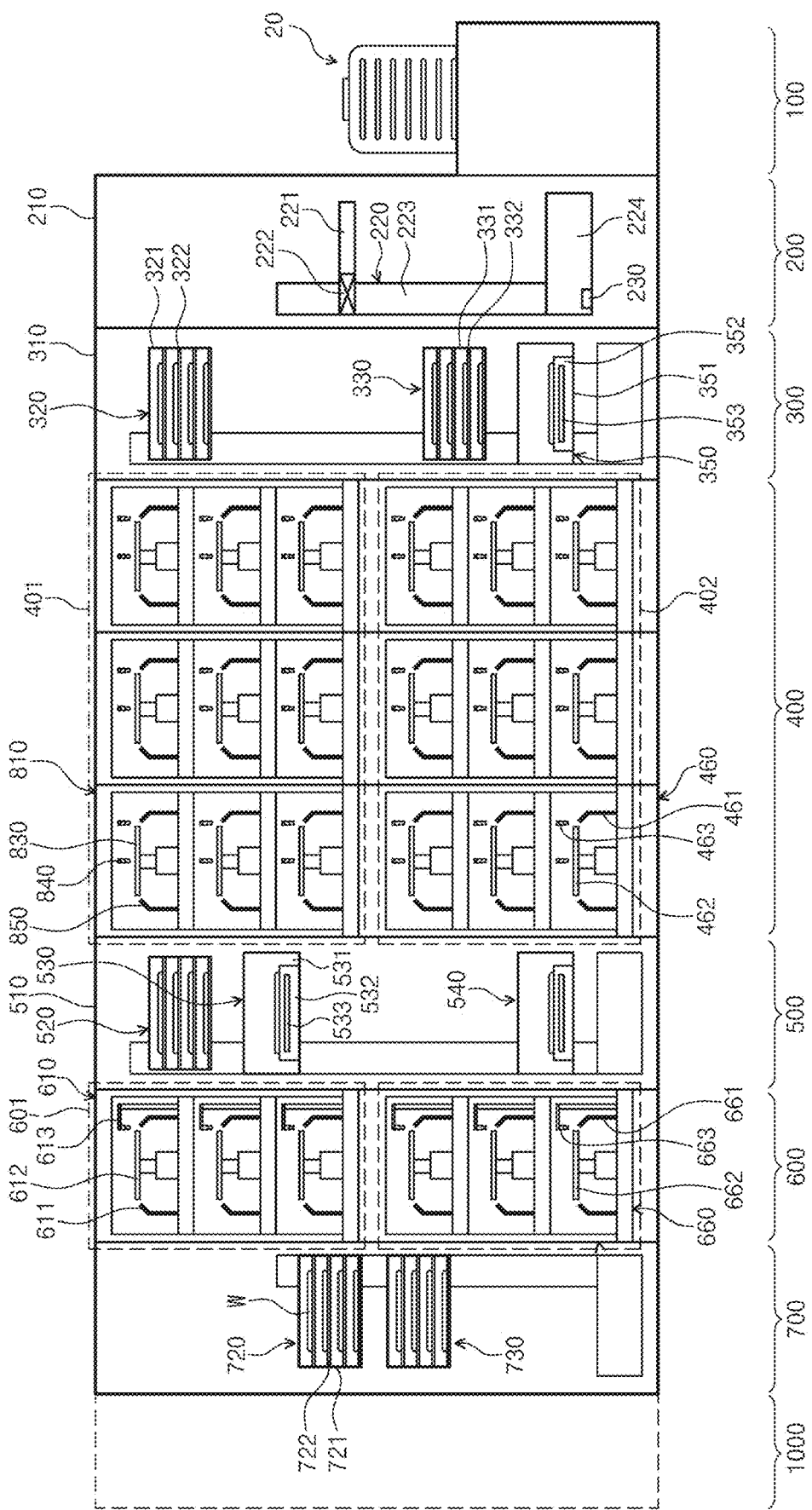
FIG. 3 is a cross-sectional view of the system of FIG. 2, taken along a line A-A of FIG. 2.
Figure 4:
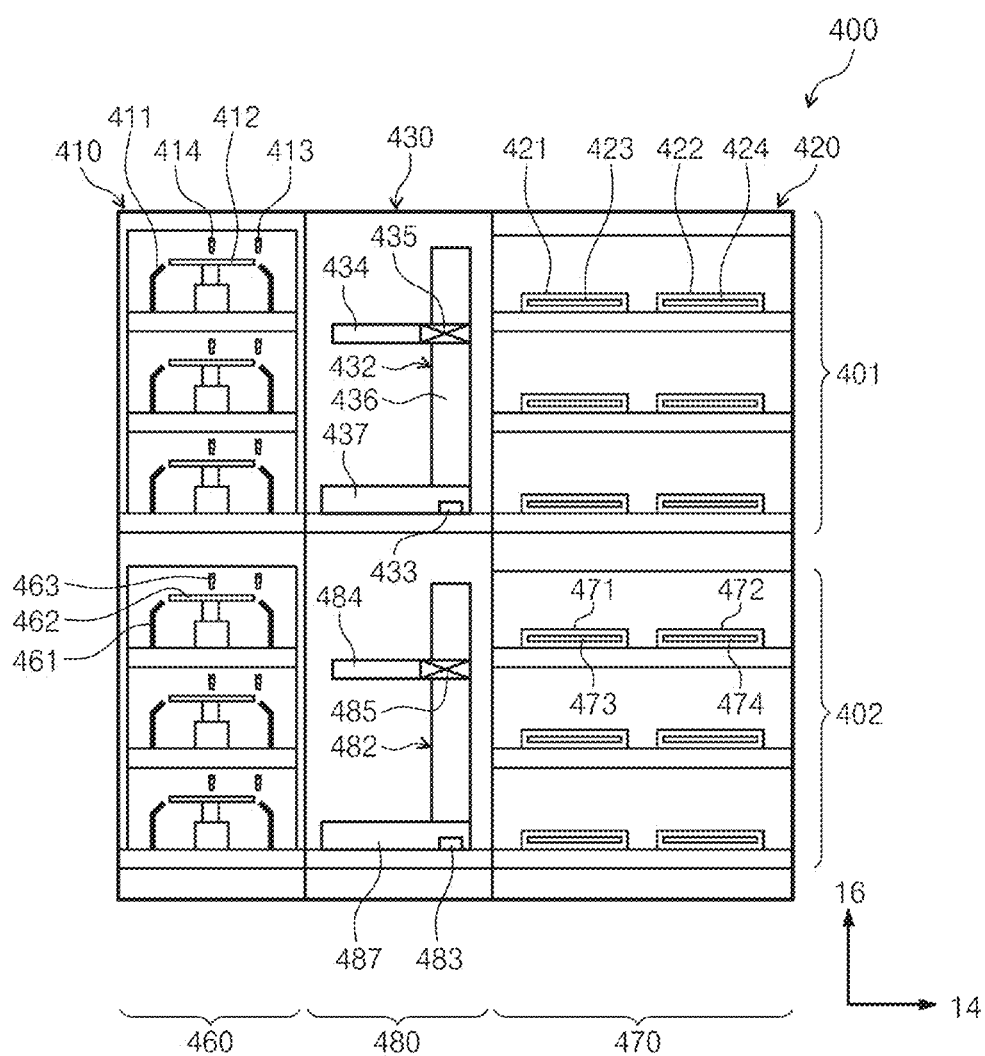
FIG. 4 is a cross-sectional view of the system of FIG. 2, taken along line B-B of FIG. 1.
Figure 5:
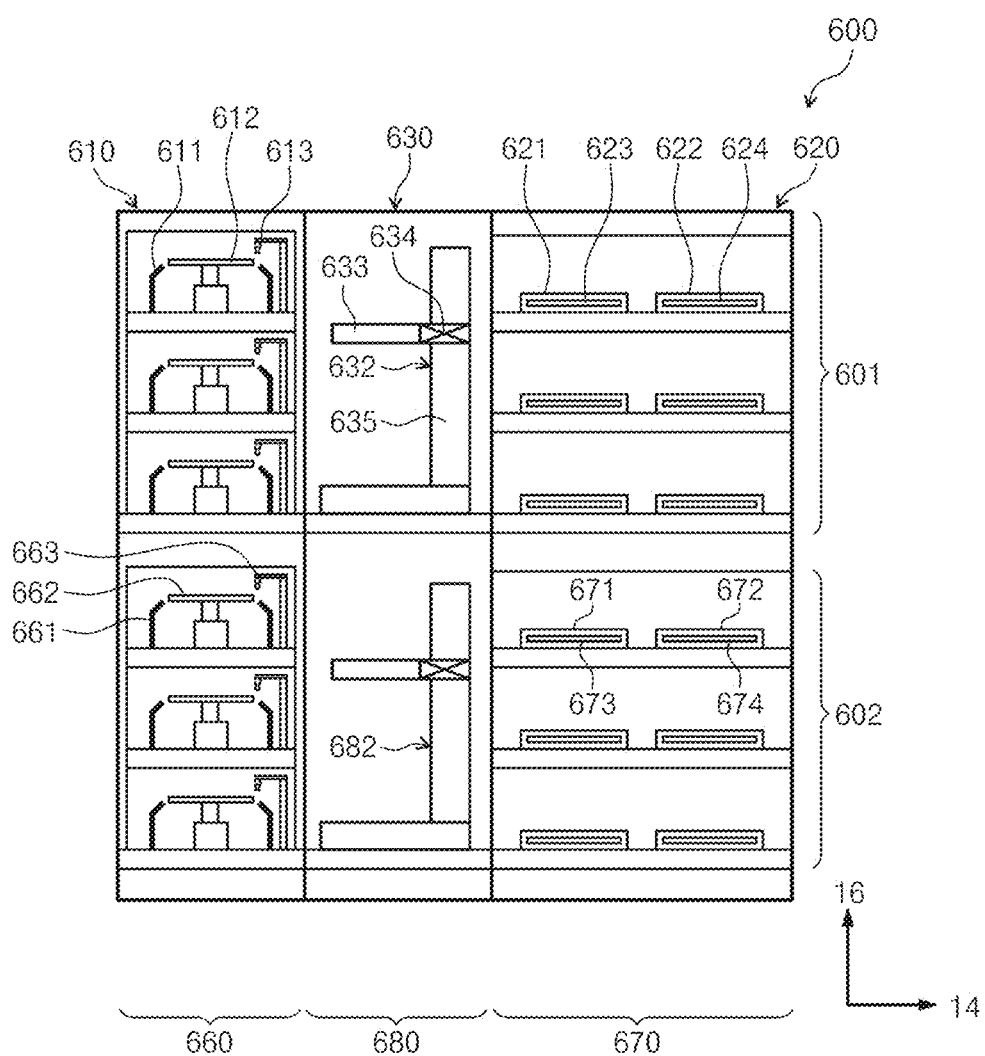
FIG. 5 is a cross-sectional view of the system of FIG. 2, taken along a line C-C of FIG. 2.

FIG. 2 is a view of a substrate treating system, when viewed from a top. FIG. 3 is a cross-sectional view of the system of FIG. 2, taken along a line A-A of FIG. 2. FIG. 4 is a cross-sectional view of the system of FIG. 2, taken along line B-B of FIG. 1. FIG. 5 is a cross-sectional view of the system of FIG. 2, taken along line C-C of FIG. 1.

Referring to FIGS. 2 to 5, the substrate treating system 1 includes a load port 100, an index module 200, a first buffer module 300, an application/development module 400, a second buffer module 500, a pre/post-exposure treating module 600, and an interface module 700. The load port 100, the index module 200, the first buffer module 300, the application/development module 400, the second buffer module 500, the pre/post-exposure treating module 600, and the interface module 700 are sequentially disposed in a row in one direction.

Hereinafter, a direction in which the load port 100, the index module 200, the first buffer module 300, the application/development module 400, the second buffer module 500, the pre/post-exposure treating module 600, and the interface module 700 are disposed will be referred to as a first direction 12, and a direction that is perpendicular to the first direction 12 when viewed from the top will be referred to as a second direction 14, and a direction that is perpendicular to the first direction 12 and the second direction 14 will be referred to as a third direction 16.

A substrate "W" is moved while being received in a cassette 20. Then, the cassette 20 has a structure that is sealed from the outside. For example, a front open unified pod (FOUP) that has a door on the front side may be used as the cassette 20.

Hereinafter, the load port 100, the index module 200, the first buffer module 300, the application/development module 400, the second buffer module 500, the pre/post-exposure treating module 600, and the interface module 700 will be described in detail.

The load port 100 has a carrier 120 on which the cassette 20, in which the substrates "W" are received, is positioned. A plurality of carriers 120 are provided, and are disposed along the second direction 14 in a row. In FIG. 2, four carriers 120 are provided.

The index module 200 feeds a substrate "W" between the cassette 20 positioned on the carrier 120 of the load port 100 and the first buffer module 300. The index module 200 has a frame 210, an index robot 220, and a guide rail 230. The frame 210 has a substantially rectangular parallelepiped shape having an empty interior, and is disposed between the load part 100 and the first buffer module 300. The frame 210 of the index module 200 may have a height smaller than that of a frame 310 of the first buffer module 300, which will be described below. The index robot 220 and the guide rail 230 are disposed in the frame 210. The index robot 220 has a four-axis driven structure such that a hand 221 that directly handles a substrate "W" is movable and rotatable in the first direction 12, the second direction 14, and the third direction 16. The index robot 220 has a hand 221, an arm 222, a support 223, and a prop 224. The hand 221 is fixedly installed in the arm 222. The arm 222 has a flexible and rotatable structure. The support 223 is configured such that the lengthwise direction thereof is disposed along the third direction 16. The arm 222 is coupled to the support 223 to be movable along the support 223. The support 223 is fixedly coupled to the prop 224. The guide rail 230 is provided such that the lengthwise direction thereof is disposed along the second direction 14. The prop 224 is coupled to the guide rail 230 to be linearly movable along the guide rail 230. Although not illustrated, the frame 210 is further provided with a door opener that opens and closes a door of the cassette 20.

The first buffer module 300 has a frame 310, a first buffer 320, a second buffer 330, a cooling chamber 350, and a first buffer robot 360. The frame 310 has a rectangular parallelepiped shape having an empty interior, and is disposed between the index module 200 and the application/development module 400. The first buffer 320, the second buffer 330, the cooling chamber 350, and the first buffer robot 360 are situated within the frame 310. The cooling chamber 350, the second buffer 330, and the first buffer 320 are disposed along the third direction 16 sequentially from the bottom. The first buffer 320 is situated at a height corresponding to an application module 401 of the application/development module 400, which will be described below, and the second buffer 330 and the cooling chamber 350 are situated at a height corresponding to a development module 402 of the application/development module 400, which will be described below. The first buffer robot 360 is spaced apart by a predetermined distance in the second direction 14 from the second buffer 330, the cooling chamber 350, and the first buffer 320.

The first buffer 320 and the second buffer 330 temporarily preserve a plurality of substrates "W". The second buffer 330 has a housing 331 and a plurality of supports 332. The supports 332 are disposed within the housing 331, and are spaced apart from one another along the third direction 16. One substrate "W" is positioned on each of the supports 332. The housing 331 has openings (not illustrated) on a side on which the index robot 220 is provided, on a side on which the first buffer robot 360 is provided, and on a side on which a development robot 482 is provided so that the index robot 220, the first buffer robot 360, and a development robot 482 of the development module 402, which will be described below, carries a substrate "W" into or out of the support 332 in the housing 331. The first buffer 320 has a structure that is substantially similar to that of the second buffer 330. Meanwhile, the housing 321 of the first buffer 320 has an opening on a side on which the first buffer robot 360 is provided and on a side on which an application robot 432 situated in the application module 401, which will be described below, is provided. The number of supports 322 provided for the first buffer 320 and the number of supports 332 provided for the second buffer 330 may be the same or different. According to an embodiment, the number of the supports 332 provided for the second buffer 330 may be larger than the number of the supports 332 provided for the first buffer 320.

The first buffer robot 360 feeds a substrate "W" between the first buffer 320 and the second buffer 330. The first buffer robot 360 has a hand 361, an arm 362, and a support 363. The hand 361 is fixedly installed in the arm 362. The arm 362 has a flexible structure, and allows the hand 361 to be moved along the second direction 14. The arm 362 is coupled to the support 363 to be linearly movable in the third direction 16 along the support 363. The support 363 has a length extending from a location corresponding to the second buffer 330 to a location corresponding to the first buffer 320. The support 363 may be provided to extend longer upwards or downwards. The first buffer robot 360 may be provided such that the hand 361 is simply two-axis driven along the second direction 14 and the third direction 16.

The cooling chamber 350 cools a substrate "W". The cooling chamber 350 has a housing 351 and a cooling plate 352. The cooling plate 352 has a cooling unit 353 that cools an upper surface thereof on which a substrate "W" is positioned and the substrate "W". Various types such as a cooling type using cooling water and a cooling type using a thermoelectric element may be used as the cooling unit 353. A lift pin assembly (not illustrated) that locates a substrate "W" on the cooling plate 352 may be provided in the cooling chamber 350. The housing 351 has openings (not illustrated) on a side on which the index robot 220 is provided and on a side on which the development robot 482 is provided so that the index robot 220 and the development robot 482 provided for the development robot 402, which will be described below, carry a substrate "W" into or out of the cooling plate 352. Doors (not illustrated) that open and close the aforementioned openings may be provided in the cooling chamber 350.

The application/development module 400 performs a process of applying a photoresist onto a substrate "W" before an exposure process and a process "W" after the exposure process. The of developing the substrate application/development module 400 has a substantially rectangular parallelepiped shape. The application/development module 400 has an application module 401 and a development module 402. The application module 401 and the development module 402 may be disposed to be partitioned from each other in different layers. According to an example, the application module 401 is situated on the development module 402.

The application module 401 performs a process of applying a photosensitive liquid such as a photoresist onto a substrate "W" and a heat treating process of, for example, heating and cooling the substrate "W" before and after the resist applying process. The application module 401 has a resist applying chamber 410, a bake chamber 420, and a carrying chamber 430. The resist applying chamber 410, the bake chamber 420, and the carrying chamber 430 are sequentially disposed along the second direction 14. Accordingly, the resist applying chamber 410 and the bake chamber 420 are spaced apart from each other in the second direction 14 while the carrying chamber 430 is interposed therebetween. A plurality of resist applying chambers 410 may be provided, and a plurality of resist applying chambers 410 may be provided in each of the first direction 12 and the third direction 16. In the drawings, six resist applying chambers 410 are illustrated as an example. A plurality of bake chamber 420 may be provided in each of the first direction 12 and the third direction 16. In the drawings, six bake chambers 420 are illustrated as an example. However, unlike this, a larger number of bake chambers 420 may be provided.

The carrying chamber 430 is situated in parallel to the first buffer 320 of the first buffer module 300 in the first direction 12. An application robot 432 and a guide rail 433 may be situated in the carrying chamber 430. The carrying chamber 430 has a substantially rectangular shape. The application robot 432 feeds a substrate "W" between the bake chambers 420, the resist applying chambers 410, the first buffer 320 of the first buffer module 300, and the first cooling chamber 520 of the second buffer module 500. The guide rail 433 is disposed such that the lengthwise direction thereof is parallel to the first direction 12. The guide rail 433 guides the application robot 432 such that the application robot 432 is linearly moved. The application robot 432 has a hand 434, an arm 435, a support 436, and a prop 437. The hand 434 is fixedly installed in the arm 435. The arm 435 has a flexible structure such that the hand 434 is movable horizontally. The support 436 is provided such that the lengthwise direction thereof is disposed along the third direction 16. The arm 435 is coupled to the support 436 to be linearly movable in the third direction 16 along the support 436. The support 436 is fixedly coupled to the prop 437, and the prop 437 is coupled to the guide rail 433 to be movable along the guide rail 433.

The resist applying chambers 410 have the same structure. However, the types of photoresists used in the resist applying chambers 410 may be different. As an example, the photoresist may be a chemical amplification resist. The resist applying chamber 410 is provided for a substrate treating apparatus that applies a photoresist onto the substrate "W". The substrate treating apparatus 800 performs a liquid applying process, and a detailed description thereof will be described with reference to FIGS. 6 to 7 as follows.

Referring back to FIGS. 2 to 5, the bake chamber 420 heat-treats the substrate "W". For example, the bake chambers 420 perform a prebake process of eliminating organic substances and moisture on the surface of the substrate "W" by heating the substrate "W" at a predetermined temperature before a photoresist is applied or a soft bake process performed after a photoresist is applied onto the substrate "W", and performs a cooling process of cooling the substrate "W" after the heating processes. The bake chamber 420 has a cooling plate 421 and a heating plate 422. The cooling plate 421 is provided with a cooling unit 423 such as cooling water or a thermoelectric element. The heating plate 422 is provided with a heating unit 424 such as a heating wire or a thermoelectric element. The cooling plate 421 and the heating plate 422 may be provided in one bake chamber 420. Optionally, some of the bake chambers 420 may include only a cooling plate 421, and some of the bake chambers 420 may include only a heating plate 422.

The development module 402 includes a process of eliminating a photoresist by supplying a development liquid to obtain a pattern on the substrate "W", and a heat treating process, such as heating and cooling, which are performed on the substrate "W" before and after the development process. The development module 402 has a development chamber 460, a bake chamber 470, and a carrying chamber 480. The development chamber 460, the bake chamber 470, and the carrying chamber 480 are sequentially disposed along the second direction 14. Accordingly, the development chamber 460 and the bake chamber 470 are spaced apart from each other in the second direction 14 while the carrying chamber 480 is interposed therebetween. A plurality of development chambers 460 may be provided, and a plurality of development chambers 460 may be provided in each of the first direction 12 and the third direction 16. In the drawings, six development chambers 460 are illustrated as an example. A plurality of bake chamber 470 may be provided in each of the first direction 12 and the third direction 16. In the drawings, six bake chambers 470 are illustrated as an example. However, unlike this, a larger number of bake chambers 470 may be provided.

The carrying chamber 480 is situated in parallel to the second buffer 330 of the first buffer module 300 in the first direction 12. A development robot 482 and a guide rail 483 may be situated in the carrying chamber 480. The carrying chamber 480 has a substantially rectangular shape. The development robot 482 feeds the substrate "W" between the bake chambers 470, the development chambers 460, the second buffer 330 and the cooling chamber 350 of the first buffer module 300, and the second cooling chamber 540 of the second buffer module 500. The guide rail 483 is disposed such that the lengthwise direction thereof is parallel to the first direction 12. The guide rail 483 guides the development robot 482 such that the development robot 482 is linearly moved in the first direction 12. The development robot 482 has a hand 484, an arm 485, a support 486, and a prop 487. The hand 484 is fixedly installed in the arm 485. The arm 485 has a flexible structure such that the hand 484 is movable horizontally. The support 486 is provided such that the lengthwise direction thereof is disposed along the third direction 16. The arm 485 is coupled to the support 486 to be linearly movable in the third direction 16 along the support 486. The support 486 is fixedly coupled to the prop 487. The prop 487 is coupled to the guide rail 483 to be linearly movable along the guide rail 483.

The development chambers 460 have the same structure. However, the types of development liquids used in the development chambers 460 may be different. The development chambers 460 eliminate an area of the photoresist on the substrate "W", to which light is irradiated. Then, an area of the protective film, to which light is irradiated, is eliminated together. Optionally, only an area of the photoresist and the protective film, to which light is not irradiated, may be eliminated according to the type of the used photoresist.

The development chamber 460 has a container 461, a support plate 462, and a nozzle 463. The container 461 has an open-topped cup shape. The support plate 462 is situated in the container 461, and supports the substrate W. The support plate 462 may be provided to be rotatable. The nozzle 463 supplies a development liquid onto the substrate "W" positioned on the support plate 462. The nozzle 463 may have a circular pipe shape, and may supply a development liquid to the center of the substrate "W". Optionally, the nozzle 463 may have a length corresponding to the diameter of the substrate "W", and the discharge hole of the nozzle 463 may be a slit. The development chamber 460 may be further provided with a nozzle 464 that supplies a cleaning liquid such as deionized water to clean the surface of the substrate "W", to which the development liquid is additionally supplied.

{The bake chamber 470 heat-treats the substrate "W". For example, the bake chambers 470 may perform a post bake process of heating the substrate "W" before the development process, a hard bake process of heating the substrate "W" after the development process, and a cooling process of cooling the heated wafer after the bake process. The bake chamber 470 has a cooling plate 471 and a heating plate 472. The cooling plate 471 is provided with a cooling unit 473 such as cooling water or a thermoelectric element. The heating plate 472 is provided with a heating unit 474 such as a heating wire or a thermoelectric element. The cooling plate 471 and the heating plate 472 may be provided in one bake chamber 470. Optionally, some of the bake chambers 470 may include only a cooling plate 471, and some of the bake chambers 470 may include only a heating plate 472.

As described above, the application/development module 400 is provided such that the application module 401 and the development module 402 are separated. When viewed from the top, the application module 401 and the development module 402 may have the same chamber disposition.

The second buffer module 500 is provided as a passage through which the substrate "W" is transported, between the application/development module 400 and the pre/post-exposure module 600. The second buffer module 500 performs a process such as a cooling process or an edge exposing process on the substrate "W". The second buffer module 500 has a frame 510, a buffer 520, a first cooling chamber 530, a second cooling chamber 540, an edge exposing chamber 550, and a second buffer robot 560. The frame 510 has a rectangular parallelepiped shape. The buffer 520, the first cooling chamber 530, the second cooling chamber 540, the edge exposing chamber 550, and the second buffer robot 560 are situated in the frame 510. The buffer 520, the first cooling chamber 530, and the edge exposing chamber 550 are disposed at a height corresponding to the application module 401. The second cooling chamber 540 is disposed at a height corresponding to the development module 402. The buffer 520, the first cooling chamber 530, and the second cooling chamber 540 are disposed in a row along the third direction 16. When viewed from the top, the buffer 520 is disposed along the carrying chamber 430 of the application module 401 in the first direction 12. The edge exposing chamber 550 is spaced apart from the buffer 520 or the first cooling chamber 530 by a predetermined distance in the second direction 14.

The second buffer robot 560 transports the substrate "W" between the buffer 520, the first cooling chamber 530, and the edge exposing chamber 550. The second buffer robot 560 is situated between the edge exposing chamber 550 and the buffer 520. The second buffer robot 560 may have a structure that is similar to that of the first buffer robot 360. The first cooling chamber 530 and the edge exposing chamber 550 performs a succeeding process on the wafers "W", on which the application module 401 has performed a process. The first cooling chamber 530 cools the substrate "W", on which the application module 401 has performed a process. The first cooling chamber 530 has a structure similar to that of the cooling chamber 350 of the first buffer module 300. The edge exposing chamber 550 exposes peripheries of the wafers "W", on which the first cooling chamber 530 has performed a cooling process. The buffer 520 temporarily preserves the substrates "W" before the substrates "W", on which the edge exposing chamber 550 has performed a process, are transported to a pre-treatment module 601, which will be described below. The second cooling chamber 540 cools the wafers "W" before the wafers "W", on which a post-treatment module 602, which will be described below, has performed a process, are transported to the development module 402. The second buffer module 500 may further have a buffer at a height corresponding to the development module 402. In this case, the wafers "W", on which the post-treatment module 602 has performed a process, may be transported to the development module 402 after being temporarily preserved in the added buffer.

When the exposure apparatus 1000 performs an immersion/exposure process, the pre/post-exposure module 600 may perform a process of applying a protective film that protects the photoresist film applied to the substrate "W" during the immersion/exposure process. The pre/post-exposure module 600 may perform a process of cleaning the substrate "W" after the exposure process. Furthermore, when the application process is performed by using a chemical amplification resist, the pre/post-exposure module 600 may perform a bake process after the exposure process.

The pre/post-exposure module 600 has a pre-treatment module 601 and a post-treatment module 602. The pre-treatment module 601 performs a process of treating the substrate "W" before the exposure process, and the post-treatment module 602 performs a process of treating the substrate "W" after the exposure process. The pre-treatment module 601 and the post-treatment module 602 may be disposed to be partitioned from each other in different layers. According to an example, the pre-treatment module 601 is situated on the post-treatment module 602. The pre-treatment module 601 has the same height as that of the application module 401. The post-treatment module 602 has the same height as that of the development module 402. The pre-treatment module 601 has a protective film applying chamber 610, a bake chamber 620, and a carrying chamber 630. The protective film applying chamber 610, the carrying chamber 630, and the bake chamber 620 are sequentially disposed along the second direction 14. Accordingly, the protective film applying chamber 610 and the bake chamber 620 are spaced apart from each other in the second direction 14 while the carrying chamber 630 is interposed therebetween. A plurality of protective film applying chambers 610 are provided, and the plurality of protective film applying chambers 610 are disposed along the third direction 16 to form different layers. Optionally, a plurality of protective film applying chambers 610 may be provided in each of the first direction 12 and the third direction 16. A plurality of bake chambers 620 are provided, and the plurality of bake chambers 620 are disposed along the third direction 16 to form different layers. Optionally, a plurality of bake chambers 620 may be provided in each of the first direction 12 and the third direction 16.

The carrying chamber 630 is situated in parallel to the first cooling chamber 530 of the second buffer module 500 in the first direction 12. A pre-treatment robot 632 is situated in the carrying chamber 630. The carrying chamber 630 has a substantially square or rectangular shape. The pre-treatment robot 632 feeds the substrate "W" between the protective film applying chambers 610, the bake chambers 620, the buffer 520 of the second buffer module 500, and a first buffer 720 of the interface module 700, which will be described below. The pre-treatment robot 632 has a hand 633, an arm 634, and a support 635. The hand 633 is fixedly installed in the arm 634. The arm 634 has a flexible and rotatable structure. The arm 634 is coupled to the support 635 to be linearly movable in the third direction 16 along the support 635.

The protective film applying chamber 610 applies a protective film that protects a resist film during the immersion/exposure process, onto the substrate "W". The protective film applying chamber 610 has a housing 611, a support plate 612, and a nozzle 613. The housing 611 has an open-topped cup shape. The support plate 612 is situated in the housing 611, and supports the substrate "W". The support plate 612 may be provided to be rotatable. The nozzle 613 supplies a protection liquid for forming a protective film onto the substrate "W" positioned on the support plate 612. The nozzle 613 has a circular pipe shape, and may supply a protection liquid to the center of the substrate "W". Optionally, the nozzle 613 may have a length corresponding to the diameter of the substrate "W", and the discharge hole of the nozzle 613 may be a slit. In this case, the support plate 612 may be provided in a fixed state. The protection liquid includes an expandable material. The protection liquid may be a material that has a low affinity for a photoresist and water. For example, the protection liquid may include a fluorine-based solvent. The protective film applying chamber 610 supplies a protection liquid to a central area of the substrate "W" while rotating the substrate "W" positioned on the support plate 612.

The bake chamber 620 heat-treats the substrate "W", to which the protective film is applied. The bake chamber 620 has a cooling plate 621 and a heating plate 622. The cooling plate 621 is provided with a cooling unit 623 such as cooling water or a thermoelectric element. The heating plate 622 is provided with a heating unit 624 such as a heating wire or a thermoelectric element. The heating plate 622 and the cooling plate 621 may be provided in one bake chamber 620. Optionally, some of the bake chambers 620 may include only a heating plate 622, and some of the bake chambers 620 may include only a cooling plate 621.

The post-treatment module 602 has a cleaning chamber 660, a post-exposure bake chamber 670, and a carrying chamber 680. The cleaning chamber 660, the carrying chamber 680, and the post-exposure chamber 670 are sequentially disposed along the second direction 14. Accordingly, the cleaning chamber 660 and the post-exposure bake chamber 670 are spaced apart from each other in the second direction 14 while the carrying chamber 680 is interposed therebetween. A plurality of cleaning chambers 660 are provided, and the plurality of cleaning chambers 660 are disposed along the third direction 16 to form different layers. Optionally, a plurality of cleaning chambers 660 may be provided in each of the first direction 12 and the third direction 16. A plurality of post-exposure bake chambers 670 are provided, and the plurality of post-exposure bake chambers 670 are disposed along the third direction 16 to form different layers. Optionally, a plurality of post-exposure bake chambers 670 may be provided in each of the first direction 12 and the third direction 16.

When viewed from the top, the carrying chamber 680 is situated in parallel to the second cooling chamber 540 of the second buffer module 500 in the first direction 12. The carrying chamber 680 has a substantially square or rectangular shape. A post-treatment robot 682 is situated in the carrying chamber 680. The post-treatment robot 682 transports the substrate "W" between the cleaning chambers 660, the post-exposure bake chambers 670, the second cooling chamber 540 of the second buffer module 500, and a second buffer 730 of the interface module 700, which will be described below. The post-treatment robot 682 provided in the post-treatment module 602 may have the same structure as that of the pre-treatment robot 632 provided in the pre-treatment module 601.

The cleaning chamber 660 cleans the substrate "W" after the exposure process. The cleaning chamber 660 has a housing 661, a support plate 662, and a nozzle 663. The housing 661 has an open-topped cup shape. The support plate 662 is situated in the housing 661, and supports the substrate "W". The support plate 662 may be provided to be rotatable. The nozzle 663 supplies a cleaning liquid onto the substrate "W" positioned on the support plate 662. The cleaning liquid may be water such as deionized water. The cleaning chamber 660 supplies a cleaning liquid to a central area of the substrate "W" while rotating the substrate "W" positioned on the support plate 662. Optionally, the nozzle 663 may be linearly moved or rotated from a central area to an edge area of the substrate "W" while the substrate "W" is rotated.

After the exposure process, the bake chamber 670 heats the substrate "W", on which the exposure process has been performed, by using a far infrared ray. After the exposure process, in the bake process, the substrate "W" is heated to finish a property change of the photoresist by amplifying acid produced in the photoresist through the exposure process. After the exposure process, the bake chamber 670 has a heating plate 672. The heating plate 672 is provided with a heating unit 674 such as a heating wire or a thermoelectric element. After the exposure process, the bake chamber 670 may be further provided with a cooling plate 671 in the interior thereof. The cooling plate 671 is provided with a cooling unit 673 such as cooling water or a thermoelectric element. Optionally, a bake chamber having only a cooling plate 671 may be further provided.

As described above, the pre/post-exposure module 600 is provided such that the pre-treatment module 601 and the post-treatment module 602 are completely separated from each other. The carrying chamber 630 of the pre-treatment module 601 and the carrying chamber 680 of the post-treatment module 602 may have the same size, and may completely overlap each other when viewed from the top. The protective film applying chamber 610 and the cleaning chamber 660 may have the same size, and may completely overlap with each other when viewed from the top. The bake chamber 620 and the post-exposure chamber 670 may have the same size, and may completely overlap with each other when viewed from the top.

The interface module 700 feeds the substrate "W" between the pre/post-exposure module 600 and the exposure apparatus 1000. The interface module 700 has a frame 710, a first buffer 720, a second buffer 730, and an interface robot 740. The first buffer 720, the second buffer 730, and the interface robot 740 are situated within the frame 710. The first buffer 720 and the second buffer 730 are spaced apart from each other by a predetermined distance, and may be stacked. The first buffer 720 is disposed at a location higher than the second buffer 730. The first buffer 720 is situated at a height corresponding to the pre-treatment module 601, and the second buffer 730 is disposed at a height corresponding to the post-treatment module 602. When viewed from the top, the first buffer 720 is disposed along the first direction 12 while forming a row with the carrying chamber 630 of the pre-treatment module 601, and the second buffer 730 is disposed along the first direction 12 forming a row with the carrying chamber 630 of the post-treatment module 602.

The interface robot 740 is situated to be spaced apart from the first buffer 720 and the second buffer 730 in the second direction 14. The interface robot 740 transports the substrate "W" between the first buffer 720, the second buffer 730, and the exposure apparatus 1000. The interface robot 740 has a structure that is substantially similar to that of the second buffer robot 560.

The first buffer 720 temporarily preserves the substrates "W", on which the pre-treatment module 601 has performed a process, before they are moved to the exposure apparatus 1000. The second buffer 730 temporarily preserves the substrates "W", on which the exposure apparatus 1000 has completely performed a process, before they are moved to the post-treatment module 602. The first buffer 720 has a housing 721 and a plurality of supports 722. The supports 722 are disposed within the housing 721, and are spaced apart from one another along the third direction 16. One substrate "W" is positioned on each of the supports 722. The housing 721 has openings (not illustrated) on a side on which the interface robot 740 is provided and on a side on which the pre-treatment robot 721 is provided so that the interface robot 740 and the pre-treatment robot 632 carry a substrate "W" into or out of the support plate 722. The second buffer 730 has a structure that is substantially similar to that of the first buffer 720. Meanwhile, the housing 4531 of the second buffer 730 has openings on a side on which the interface robot 740 is provided and on a side on which the post-treatment robot 682 is provided. The interface module may be provided only with buffers and a robot as described above while a chamber that performs a certain process on a wafer is not provided.

The resist applying chamber 410 may be provided for a substrate treating apparatus that applies a photoresist onto the substrate "W", which will be described below.

Figure 6:
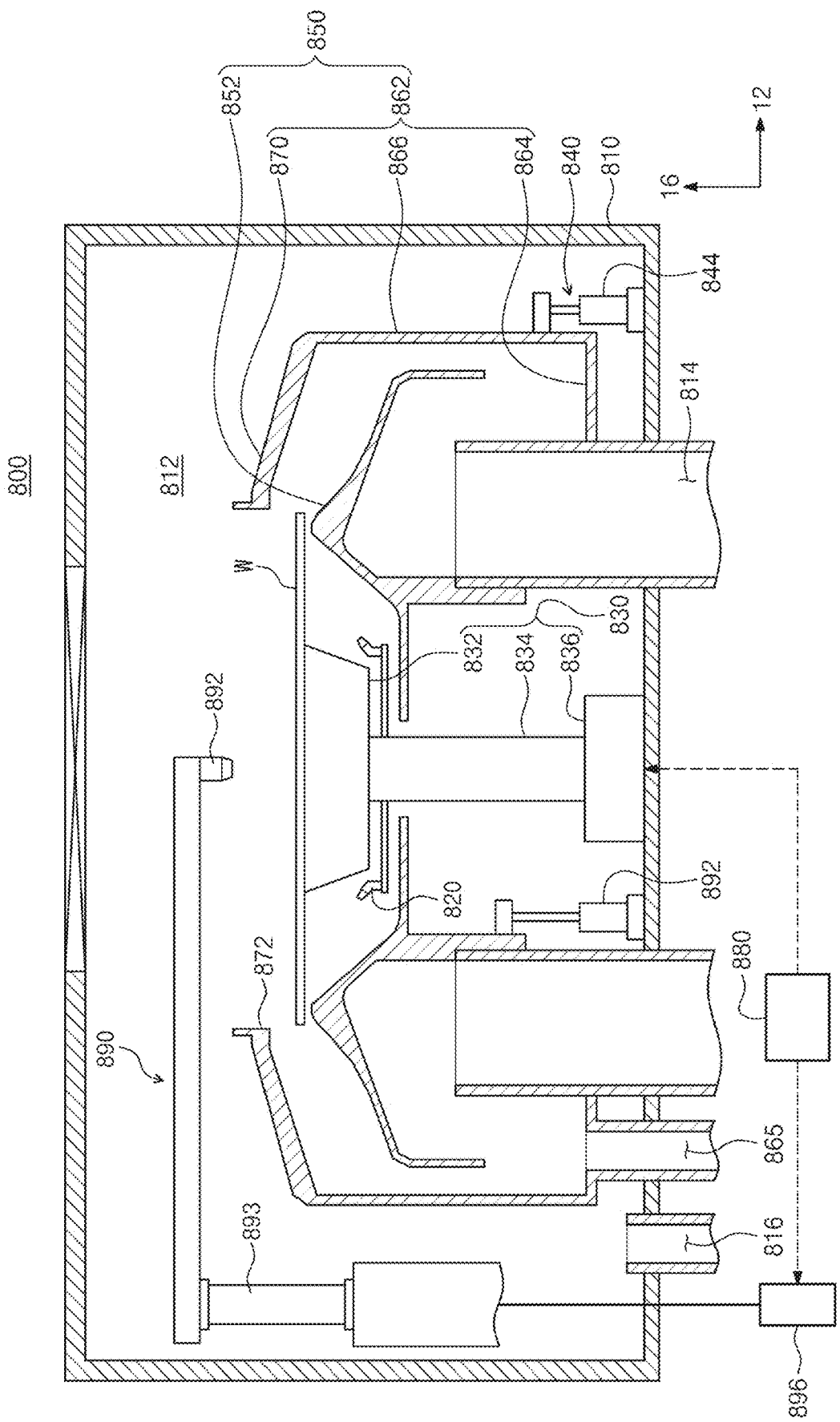
FIG. 6 is a cross-sectional view illustrating a substrate treating apparatus of FIG. 2.

FIG. 6 is a sectional view illustrating the substrate treating apparatus of FIG. 2.

Referring to FIG. 6, a substrate treating apparatus 800 is an apparatus that applies photo-resist onto a substrate "W". The substrate treating apparatus 800 includes a housing 810, a substrate support unit 830, a treatment container 850, an elevation unit 840, a liquid supply unit 890, and a controller 880.

The housing 810 has a rectangular tub shape having a treatment space 812 in the interior thereof. An opening (not illustrated) is formed on one side of the housing 810. The opening functions as a port through which a substrate "W" is carried in and out. A door is installed in the opening, and the door opens and closes the opening. If a substrate treating process is performed, the door interrupts the opening and closes the treatment space 812 of the housing 810. An inner outlet 814 and an outer outlet 816 are formed on the lower surface of the housing 810. The air in the housing 810 is exhausted to the outside through the inner outlet 814 and the outer outlet 816. According to an example, the air provided for the treatment container 850 may be exhausted through the inner outlet 814, and the air provided for the outside of the treatment container 850 may be exhausted through the outer outlet 816.

The substrate supporting unit 830 supports the substrate "W" in the treatment space 812 of the housing 810. The substrate supporting unit 830 rotates the substrate "W". The substrate supporting unit 830 includes a spin chuck 832, a rotary shaft 834, and a driver 836. The spin chuck 832 is provided for a substrate supporting member 832 that supports the substrate. The spin chuck 832 has a circular disk shape. The substrate "W" makes contact with the upper surface of the spin chuck 832. The spin chuck 832 has a diameter that is smaller than that of the substrate "W". According to an example, the spin chuck 832 may vacuum-suction the substrate "W" and chuck the substrate "W". Optionally, the spin chuck 832 may be provided for an electrostatic chuck that chucks the substrate "W" by using static electricity. The spin chuck 832 may chuck the substrate "W" by a physical force.

Meanwhile, a cleaning jig 900 may be seated on the spin chuck 832 during a cleaning process of the treatment container 850.

The rotary shaft 834 and the driver 836 are provided for rotation driving members 834 and 836 that rotate the spin chuck 832. The rotary shaft 834 supports the spin chuck 832 under the spin chuck 832. The rotary shaft 834 is provided such that the lengthwise direction thereof faces the upper and low sides. The rotary shaft 834 is provided to be rotatable about the central axis thereof. The driver 836 provides a driving force such that the rotary shaft 834 is rotated. For example, the driver 836 may be a motor that varies the rotational speed of the rotary shaft. The rotation driving members 834 and 836 may rotate the spin chuck 832 at different rotational speeds according to the substrate treatment steps.

The treatment container 850 has a treatment space 812, in which a development process is performed, in the interior thereof. The treatment container 850 may be configured to surround the substrate support unit 830. The treatment container 850 has an open-topped cup shape. The treatment container 850 includes an inner cup 852 and an outer cup 862.

The inner cup 852 has a circular cup shape that surrounds the rotary shaft 834. The inner cup 852 is situated to overlap the inner outlet 814 when viewed from the top. The upper surface of the inner cup 852 is provided such that an outer area and an inner area thereof have different angles when viewed from the top. According to an example, the outer area of the inner cup 852 is downwardly inclined as it goes away from the substrate support unit 830 and the inner area of the inner cup 852 is upwardly inclined as it goes away from the substrate support unit 830. A point where the outer area and the inner area of the inner cup 852 meet is provided to vertically correspond to a side end of the substrate "W". The outer area of the upper surface of the inner cup 852 is rounded. The outer area of the upper surface of the inner cup 852 is concave. The outer area of the upper surface of the inner cup 852 may be provided as an area through which a treatment liquid flows.

The outer cup 862 has a cup shape that surrounds the substrate supporting unit 830 and the inner cup 852. The outer cup 862 has a bottom wall 864, a side wall 866, an upper wall, and an inclined wall 870. The bottom wall 864 has a hollow circular disk shape. A recovery line 865 is formed in the bottom wall 864. The recovery line 865 recovers a treatment liquid supplied onto the substrate "W". The treatment liquid recovered by the recovery line 865 may be reused by an external liquid recycling system. The side wall 866 has a circular tub shape that surrounds the substrate supporting unit 830. The side wall 866 extends from a side end of the bottom wall 864 in a direction perpendicular to the bottom wall 864. The side wall 866 extends upwards from the bottom wall 864.

The inclined wall 870 extends from an upper end of the side wall 866 towards the inside of the outer cup 862. The inclined wall 870 is provided to become closer as it goes upwards. The inclined wall 870 has a ring shape. An upper end of the inclined wall 870 is higher than the substrate "W" supported by the substrate supporting unit 830.

The elevation unit 840 elevates the inner cup 852 and the outer cup 862. The elevation unit 840 includes an inner movable member 842 and an outer movable member 844. The inner movable member 842 elevates the inner cup 852, and the outer movable member 844 elevates the outer cup 862.

The liquid supply unit 890 may selectively supply various kinds of treatment fluids to the substrate "W".

For example, the liquid supply unit 890 may include a nozzle 892 that supplies the treatment liquid to the substrate "W" and a nozzle moving member 893. A plurality of nozzles 892 may be provided. When the plurality of nozzles 892 are provided, treatment liquid supply liens are connected to the nozzles 892, respectively. Among the plurality of nozzles 892, the nozzles 892, except for the nozzles held by the nozzle moving member 893 to discharge the treatment liquid onto the substrate, waits in home ports (not illustrated). One of the plurality of nozzles 892 may be moved to a process location and a standby location by the nozzle moving member 893. Here, the process location is a location, at which the nozzle 892 faces the substrate "W" positioned on the spin chuck 832. The standby location is a location, at which the nozzle 892 waits in the home ports 900. For example, the treatment liquid may be a photosensitive liquid such as photoresist or a cleaning liquid used for cleaning of the treatment container.

Meanwhile, the controller 880 controls the supply unit 896 that supplies the cleaning liquid to the liquid supply unit 890. The controller 880 may increase cleaning efficiency by varying the amount of the cleaning liquid supplied to the cleaning jig 900 (see FIG. 10) during the cleaning process of the treatment container 850. As an example, the controller 880 may increase and decrease the amount of the supplied cleaning liquid at a specific cycle.

The controller 880 may control the driver 836 such that a rotational speed of the spin head 832 is repeatedly accelerated and decelerated while the cleaning liquid is supplied to the cleaning jig 900.

Figure 7:
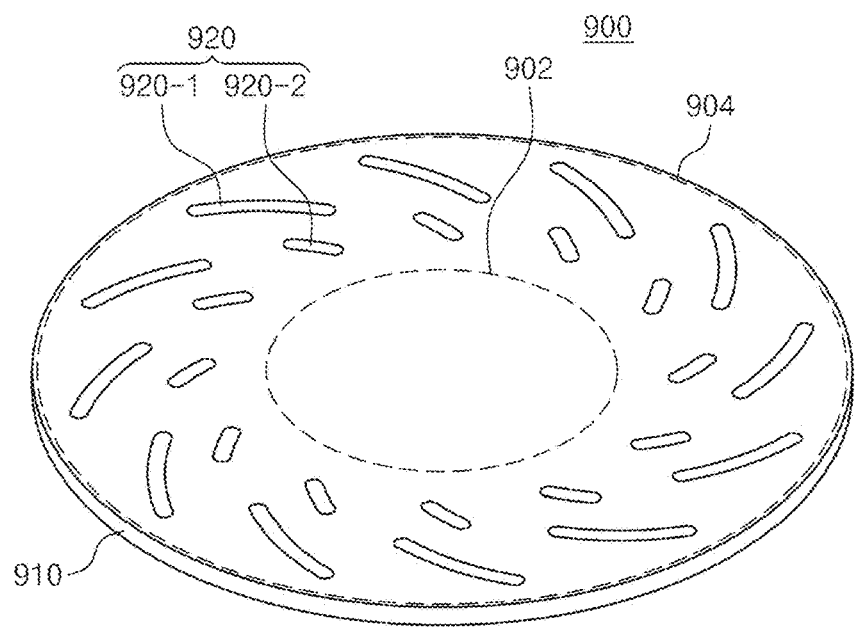
FIG. 7 is a perspective view of a cleaning jig used for cleaning of the substrate treating apparatus illustrated in FIG. 6.
Figure 8:
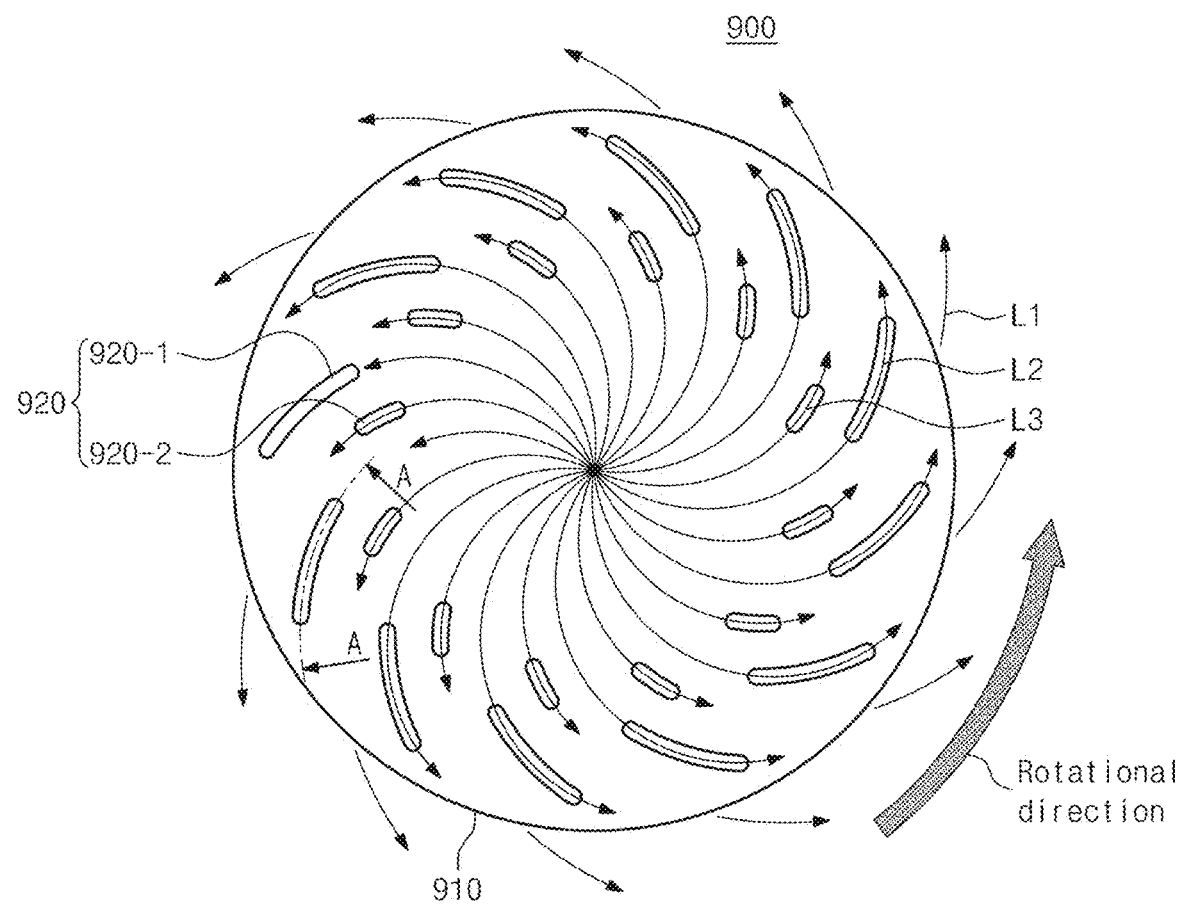
FIG. 8 is a plan view of the cleaning jig illustrated in FIG. 7.
Figure 9:
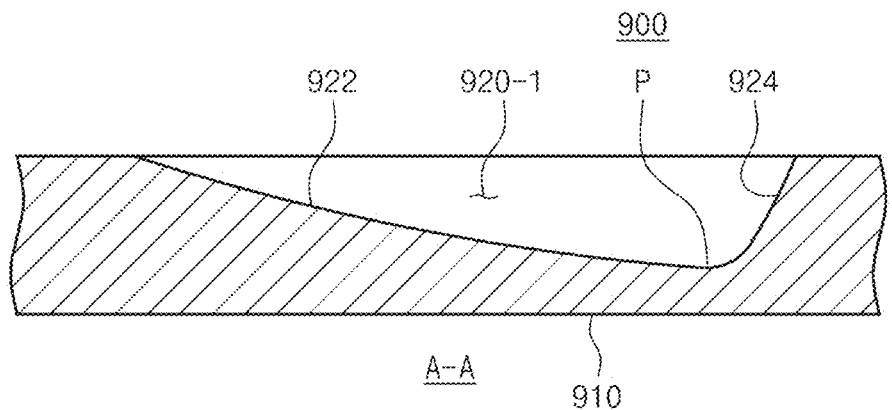
FIG. 9 is a cross-sectional view taken along line A-A of FIG. 8.

FIG. 7 is a perspective view of a cleaning jig used for cleaning of the substrate treating apparatus illustrated in FIG. 6. FIG. 8 is a plan view of the cleaning jig illustrated in FIG. 7. FIG. 9 is a cross-sectional view taken along line A-A of FIG. 8.

Referring to FIGS. 7 to 9, the cleaning jig 900 may have a circular plate shape having a specific thickness. A diameter of the cleaning jig 900 may be substantially the same as the diameter of the substrate.

The jig body 910 of the cleaning jig 900 may be divided into a central area 902 and an edge area 904. The central area 902 may be an area, to which the cleaning liquid discharged from the nozzle 892 is supplied, and the edge area 904 may be an area, in which the cleaning liquid spatters.

Spattering guide grooves 920 are formed in the edge area 904 to be recessed such that the cleaning liquid spatters with a centrifugal force due to the rotation of the spin head 832.

The spattering guide grooves 920 may include first spattering guide grooves 920-1 of a first group, and second spattering guide grooves 920-2 of a second group. The spattering guide grooves 920-2 of the second group may be arranged along a first concentric circle of the jig body at an equal interval, and the spattering guide grooves 920-1 of the first group may be arranged along a second concentric circle that is larger than the first concentric circle at an equal interval. However, the arrangement of the spattering guide grooves 920-1 and 920-2 is not limited thereto. For example, it is apparent that the spattering guide grooves may be arranged on one or two or more concentric circles.

Meanwhile, lengths of the spattering guide grooves 920-1 of the first group and the spattering guide grooves 920-2 of the second group may be different.

The spattering guide grooves 920 may be formed to be curved from the center of the cleaning jig 900 along a circumferential direction (the flow direction of the cleaning liquid).

The spattering guide grooves 920-1 of the first group and the spattering guide grooves 920-2 of the second group may have different lengths, but may have the same configuration. It is preferable that each of the spattering guide grooves 920-1 of the first group (or the spattering guide grooves of the second group 920-2) is configured such that an inclination of a first bottom surface 922 thereof that faces an outside of the cleaning jig 900 with reference to a bottom point "P" of a bottom surface thereof, a height of which is lowest, is gentler than an inclination of a second bottom surface 924 thereof that faces an inside of the cleaning jig 900.

That is, a first bottom surface 922 of the spattering guide groove 920-1 of the first group in a direction, in which the cleaning liquid spatters, with reference to the bottom point "P" of the bottom surface thereof, the height of which is lowest, is gentler than an inclination of a second bottom surface 924 thereof in an opposite direction.

The cleaning liquid supplied to the center of the cleaning jig 900 having the above-described structure flows from the center to the outside while drawing a long arc with the centrifugal force (an arrow direction illustrated in FIG. 8). Furthermore, the cleaning liquid that passes through the spattering guide grooves 920-1 and 920-2 spatters upwards along an inclination of the first bottom surface 922. A cleaning area of the cleaning liquid L2 that spatters in the spattering guide grooves 920-1 of the first group and a cleaning area of the cleaning liquid L3 that spatters in the spattering guide grooves 920-2 of the second group may be different.

That is, the cleaning jig 900 may adjust an angle, by which the cleaning liquid spatters according to the inclination of the first bottom surface 922. For example, when the first bottom surfaces 922 of the spattering guide grooves 920-1 of the first group are machined at different inclinations, the cleaning area of the treatment container may be widened and the cleaning may be efficiently performed while the cleaning liquid spatters at various angles (that is, in a wider range).

As described above, the inclinations of the bottom surfaces of the spattering guide grooves may be determined according to the cleaning range.

Although not illustrated, the widthwise cross-sections of the spattering guide grooves 920 may have various forms, such as a semicircular sectional shape, a true circle sectional shape, an upper portion of which is partially opened, a U-shaped sectional shape, an upper portion of which is opened, a four-sided sectional shape, an upper portion of which is opened, a V-shaped sectional shape, an upper portion of which is opened, and an inclined four-sided sectional shape.

Figure 10:
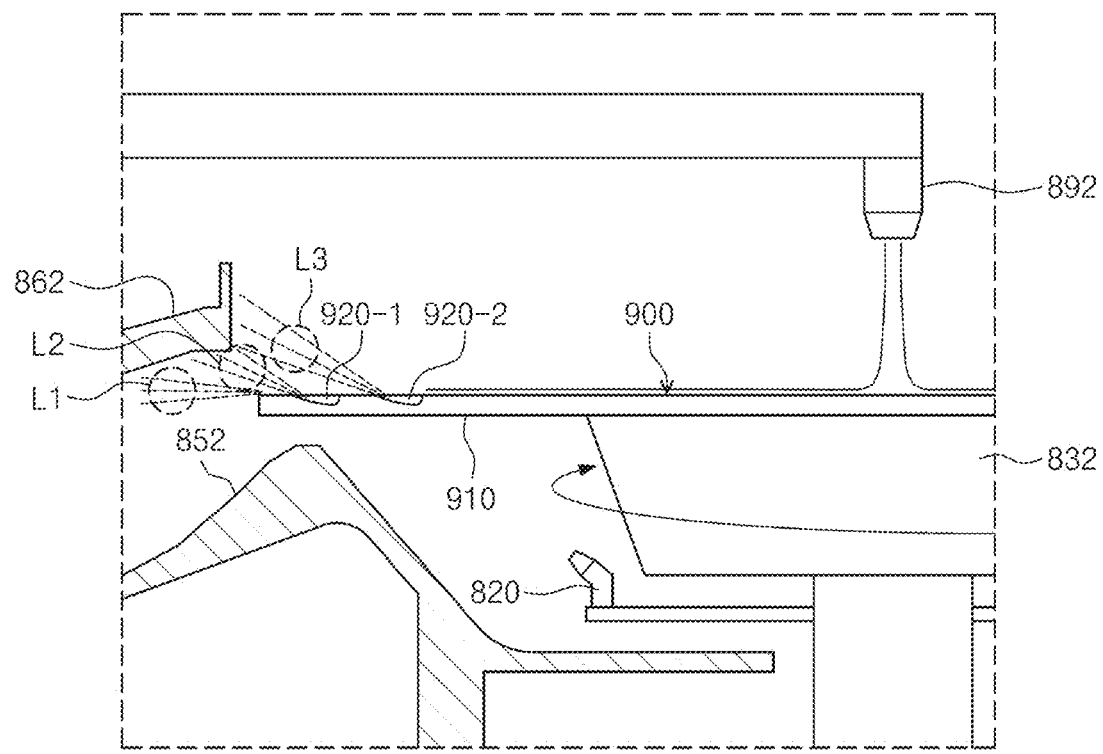
FIG. 10 is a view illustrating a process of cleaning a treatment container by using a cleaning jig.

FIG. 10 is a view illustrating a process of cleaning a treatment container by using a cleaning jig.

As in FIG. 10, the cleaning jig 900 is seated on the spin head 832. The spin head 832, on which the cleaning jig 900 is seated, is rotated at a preset speed. The nozzle 892 supplies the cleaning liquid to the upper surface of the cleaning jig 900. The cleaning liquid supplied to the upper surface of the cleaning jig 900 flows while drawing an arc from the center to an edge of the cleaning jig 900 with the centrifugal force, and a portion of the cleaning liquid spatters upwards along the spattering guide grooves 920-1 and 920-2 formed on the upper surface of the cleaning jig 900 and the remaining portions of the cleaning liquid spatters in a substantially horizontal direction along the flat upper surface of the cleaning jig 900.

Reference numeral L1 indicated in FIGS. 8 to 10 denotes a spattering direction of the cleaning liquid that spatters from the flat upper surface of the cleaning jig 900, reference numeral L2 denotes a spattering direction of the cleaning liquid that spatters in the spattering guide grooves 920-1 of the first group, and reference numeral L3 denotes a spattering direction of the cleaning liquid that spatters in the spattering guide grooves 920-2 of the second group.

Accordingly, in the cleaning jig 900, the cleaning liquid spatters in a wide range so that the cup may be efficiently washed.

It is preferable that the cleaning liquid is supplied at a variable flow rate rather than at a specific flow rate in the cleaning process of the treatment container using the cleaning jig 900. For example, when the cleaning liquid is excessively supplied to the cleaning jig 900, an amount of the cleaning liquid that spatters from the cleaning jig 900 becomes larger than an amount of the cleaning liquid that resides on the upper surface of the cleaning jig, and the cleaning liquid is filled in the spattering guide grooves 920-1 and 920-2. Thereafter, when the amount of the supplied cleaning liquid is decreased (or the supply of the cleaning liquid is temporarily stopped), the cleaning liquid fully filled in the spattering guide grooves 920-1 and 920-2 may spatter to the treatment container 850 with the centrifugal force. In this way, the cleaning liquid supplied to the cleaning jig 900 may be supplied to the cleaning jig in a pattern, in which the amount of the supplied cleaning liquid increases and decreases (or excessively supplied and insufficiently supplied/the supply is stopped) at a specific cycle.

In the cleaning process of the treatment container 850 using the cleaning jig 900, the rotational speed of the spin head 832 may vary while the cleaning liquid is supplied. For example, the rotational speed may be decreased when the cleaning liquid is excessively supplied, and the rotational speed may be increased when the cleaning liquid is insufficiently supplied.

Figure 11:
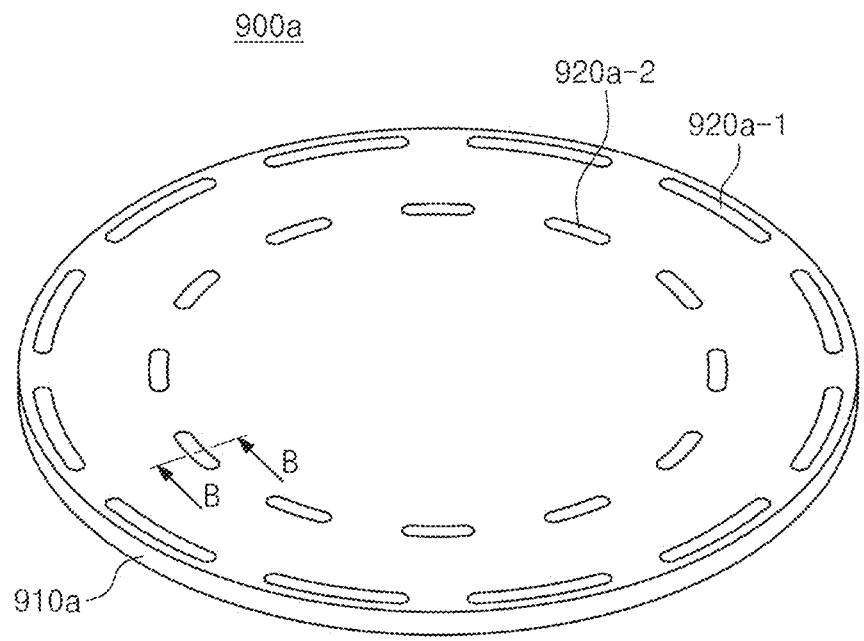
FIG. 11 is a perspective view illustrating a first modification of the cleaning jig.
Figure 12:
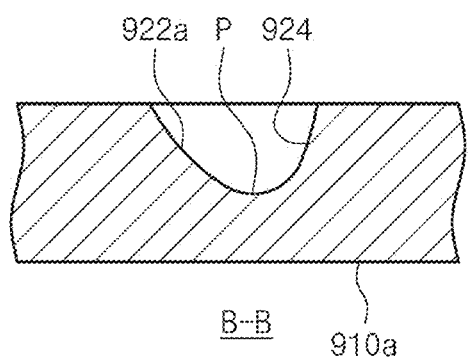
FIG. 12 is a cross-sectional view taken along line B-B of FIG. 11.

FIG. 11 is a perspective view illustrating a first modification of the cleaning jig. FIG. 12 is a cross-sectional view taken along line B-B of FIG. 11.

As illustrated in FIGS. 11 and 12, the cleaning jig 900a may include a jig body 910a having spattering grooves 920a-1 and 920a-2, and they have substantially the same configurations and functions as those of the cleaning jig 900 illustrated in FIG. 7, and thus, a difference from the modification and the present embodiment will be mainly described.

The first modification is characterized in that the spattering guide grooves 920a-1 and 920a-2 are formed along concentric circles having a specific distance from the center of the jig body 910 at an equal interval. Each of the spattering guide grooves may be configured such that an inclination of a first bottom surface 922a thereof that faces an outside of the cleaning jig 900a with reference to a bottom point "P" of a bottom surface thereof, a height of which is lowest, is gentler than an inclination of a second bottom surface 924a thereof that faces an inside of the cleaning jig 900a.

Figure 13:
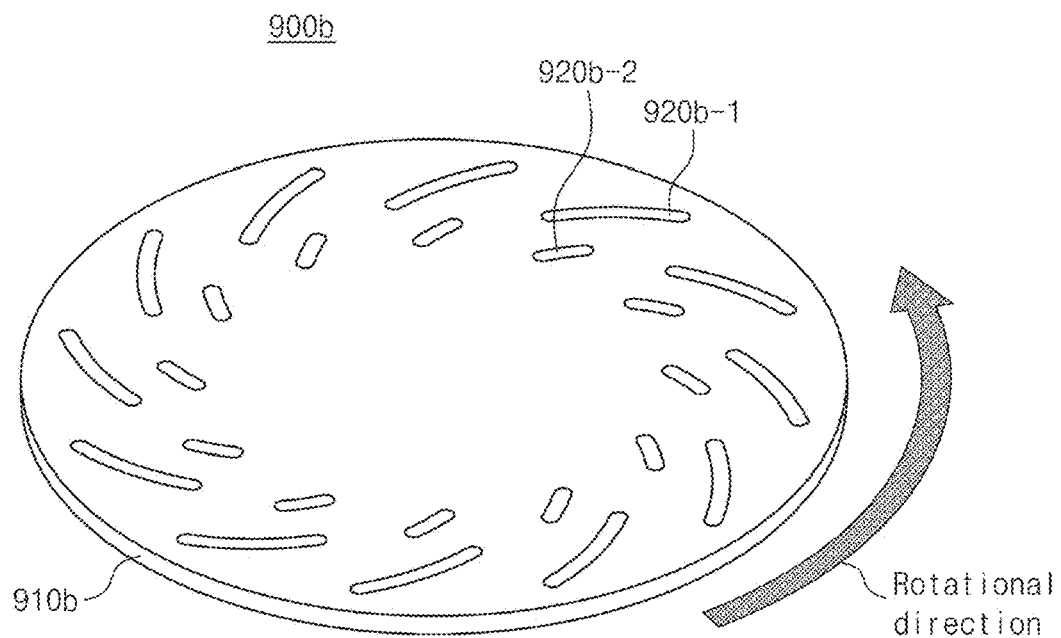
FIG. 13 is a perspective view illustrating a second modification of the cleaning jig.

FIG. 13 is a perspective view illustrating a second modification of the cleaning jig.

As illustrated in FIG. 13, the cleaning jig 900b may include a jig body 910b having spattering grooves 920b-1 and 920b-2, and they have substantially the same configurations and functions as those of the cleaning jig 900 illustrated in FIG. 7, and thus, a difference from the modification and the present embodiment will be mainly described.

In the second modification, the spattering guide grooves 920b-1 and 920b-2 are formed to be curved from the center of the cleaning jig 900b along a circumferential direction, but directions of the curves of the spattering guide grooves 920b-1 and 920b-2 are curved in a direction that is opposite to the flow directions (a rotational direction, indicated by arrows) of the cleaning liquid.

Figure 14:
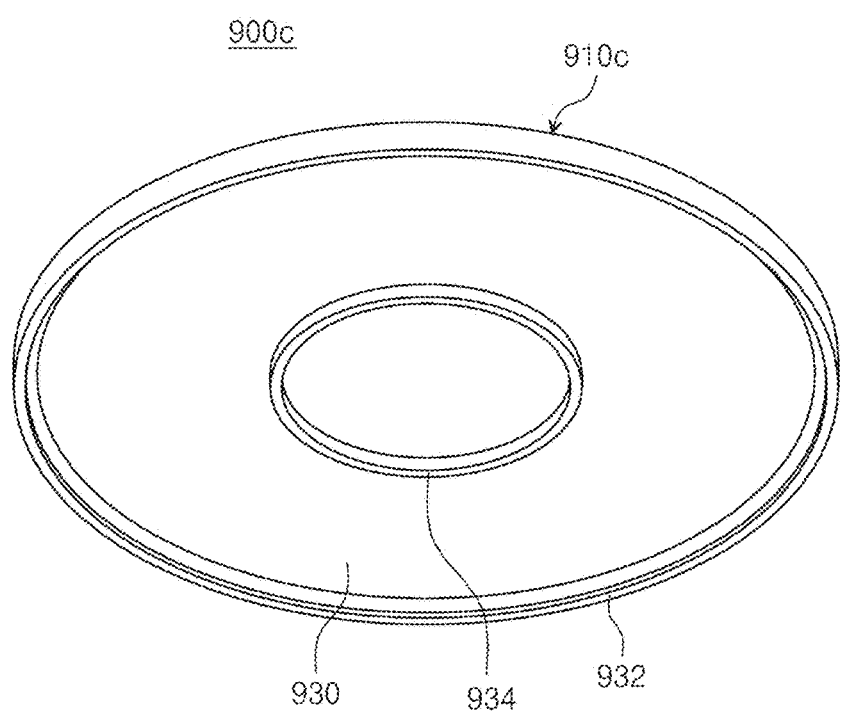
FIG. 14 is a bottom perspective view illustrating a third modification of the cleaning jig.
Figure 15:
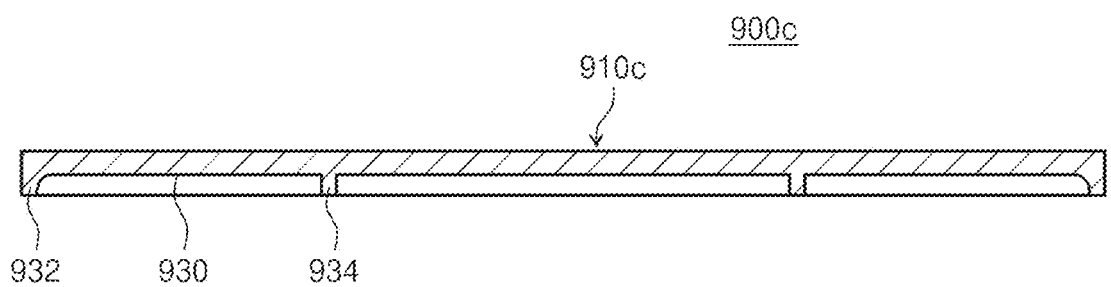
FIG. 15 is a cross-sectional view of the cleaning jig illustrated in FIG. 14.
Figure 16:
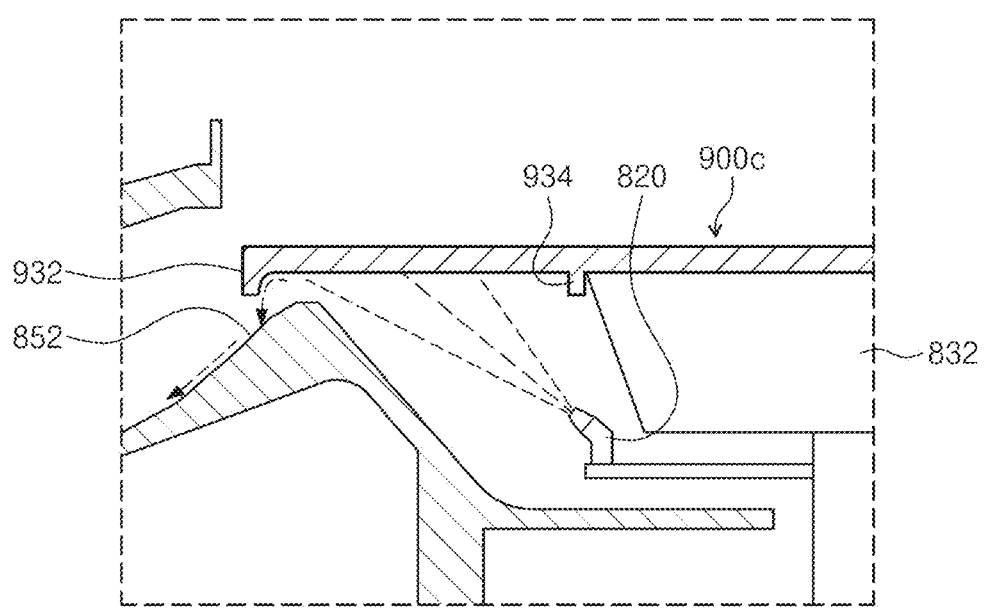
FIG. 16 is a view illustrating cleaning of a treatment container using the cleaning jig illustrated in FIG. 14.

FIG. 14 is a bottom perspective view illustrating a third modification of the cleaning jig. FIG. 15 is a cross-sectional view of the cleaning jig illustrated in FIG. 14. FIG. 16 is a view illustrating cleaning of a treatment container using the cleaning jig illustrated in FIG. 14.

As in FIGS. 14 to 16, the cleaning jig 900c has a fixing boss and a spattering guide boss 932 on an bottom surface 930 thereof. The spattering guide boss 932 protrudes downwards from an edge portion of the bottom surface 930 of the jig body 910c. The fixing boss 934 protrudes downwards from the bottom surface 930, and is located to surround an outer side of the spin head to prevent flows of the cleaning liquid when the cleaning jig 900c is seated on the spin head 832.

During the cleaning process of the substrate treating apparatus, the cleaning liquid ejected from the back nozzle 820 located below the spin head 832 flows to the outside along the bottom surface of the cleaning jig 900c. Furthermore, the cleaning liquid cleans the upper surface of the inner cup 852 while colliding with the spattering guide boss 932.

According to the embodiments of the inventive concept, the cleaning efficiency of the cup may be increased by allowing the cleaning water to spatter at various heights in an interior of the cup through the cleaning jig.

According to the embodiments of the inventive concept, the cleaning efficiency may be increased by adjusting the amount of the supplied cleaning liquid even though the support plate is not moved upwards and downwards.

According to the embodiments of the inventive concept, the cleaning liquid may spatter at various angles through recessing, and the spaces may be excellently utilized (keeping of the cleaning jig).

The effects of the inventive concept are not limited to the above-mentioned effects, and the unmentioned effects can be clearly understood by those skilled in the art to which the inventive concept pertains from the specification and the accompanying drawings.

The above detailed description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate treating apparatus comprising:
a housing having a treatment space;
a rotatable spin head provided in the treatment space;
a cup configured to surround the spin head;
a cleaning jig seated on the spin head, and configured to discharge a cleaning liquid toward the cup through rotation of the spin head; and
a nozzle unit located at an upper portion of the cleaning jig and configured to supply the cleaning liquid to a center of an upper surface of the cleaning jig,
wherein the cleaning jig includes:
spattering guide grooves formed to be recessed such that the cleaning liquid provided from the nozzle unit spatters toward the cup with a centrifugal force due to the rotation of the spin head,
wherein the spattering guide grooves are formed on an upper surface of the cleaning jig, and
wherein the spattering guide grooves are directly exposed to the treatment space when the cleaning jig is seated on the spin head,
wherein each of the spattering guide grooves is configured such that inclination of a first bottom surface thereof that faces an outside of the cleaning jig with reference to a bottom point of a bottom surface thereof, a height of which is lowest, is gentler than an inclination of a second bottom surface thereof that faces an inside of the cleaning jig.

2. The substrate treating apparatus of claim 1, wherein the spattering guide grooves are formed to be curved from the center of the cleaning jig along a circumferential direction of the cleaning jig.

3. The substrate treating apparatus of claim 2, wherein curves of the spattering guide grooves are curved in a direction corresponding to a flow direction of the cleaning liquid in the cleaning jig.

4. The substrate treating apparatus of claim 2, wherein curves of the spattering guide grooves are curved in a direction that is opposite to a flow direction of the cleaning liquid in the cleaning jig.

5. The substrate treating apparatus of claim 1, wherein the spattering guide grooves are formed on concentric circles that are distant from the center of the cleaning jig by a specific distance at an equal interval.

6. The substrate treating apparatus of claim 1, further comprising:
a back nozzle configured to eject the cleaning liquid to a bottom surface of the cleaning jig,
wherein the cleaning jig further includes:
a spattering guide boss protruding downwards from a bottom surface of an edge thereof.

7. The substrate treating apparatus of claim 1, wherein the inclinations of the first bottom surfaces of the spattering guide grooves are different.

8. The substrate treating apparatus of claim 1, further comprising:
a supply unit configured to supply the cleaning liquid to the nozzle unit; and
a controller configured to control the supply unit such that an amount of the cleaning liquid supplied to the cleaning jig increases and decreases at a specific cycle.

9. The substrate treating apparatus of claim 8, wherein the controller controls the spin head such that a rotational speed of the spin head is repeatedly accelerated and decelerated while the cleaning liquid is supplied to the cleaning jig.

10. A substrate treating apparatus comprising:
a housing having a treatment space;
a rotatable spin head provided in the treatment space;
a cup configured to surround the spin head;
a cleaning jig seated on the spin head, and configured to discharge a cleaning liquid toward the cup through rotation of the spin head; and
a nozzle unit located at an upper portion of the cleaning jig and configured to supply the cleaning liquid to a center of an upper surface of the cleaning jig,
wherein the cleaning jig includes:
spattering guide grooves formed to be recessed such that the cleaning liquid provided from the nozzle unit spatters toward the cup with a centrifugal force due to the rotation of the spin head,
wherein the spattering guide grooves are formed on an upper surface of the cleaning jig,
wherein the spattering guide grooves are directly exposed to the treatment space when the cleaning jig is seated on the spin head,
wherein each of the spattering guide grooves is configured such that a first bottom surface thereof in a direction, in which the cleaning liquid spatters, with reference to a bottom point of a bottom surface thereof, a height of which is lowest, is gentler than an inclination of a second bottom surface in an opposite direction.

11. A cleaning jig comprising:
a jig body of a circular plate shape having a specific thickness,
wherein the jig body includes:
a central area, to which a cleaning liquid is supplied from a nozzle unit; and
an edge area surrounding the central area,
wherein spattering guide grooves formed in the edge area to be recessed such that the cleaning liquid spatters with a centrifugal force due to rotation of a spin head,
wherein the spattering guide grooves are formed on an upper surface of the cleaning jig, and
wherein the spattering guide grooves are directly exposed to a treatment space when the cleaning jig is seated on the spin head,
wherein each of the spattering guide grooves are configured such that an inclination of a first bottom surface thereof that faces an outside of the cleaning jig with reference to a bottom point of a bottom surface thereof, a height of which is lowest, is gentler than an inclination of a second bottom surface thereof that faces an inside of the cleaning jig.

12. The cleaning jig of claim 11, wherein the spattering guide grooves include:
the spattering guide grooves of a first group, which are arranged along a first concentric circle of the jig body; and the spattering guide grooves of a second group, which are arranged along a second concentric circle that is larger than the first concentric circle.

13. The cleaning jig of claim 12, wherein lengths of the spattering guide grooves of the first group are different from lengths of the spattering guide grooves of the second group.

14. The cleaning jig of claim 11, wherein the spattering guide grooves are formed to be curved from the center of the cleaning jig along a circumferential direction of the cleaning jig.

15. The cleaning jig of claim 11, wherein the spattering guide grooves are formed on concentric circles that are distant from the center of the jig body by a specific distance.

16. The cleaning jig of claim 11, wherein the cleaning jig further includes:
a spattering guide boss protruding downwards from a bottom surface of an edge thereof.

17. A cleaning jig comprising:
a jig body of a circular plate shape having a specific thickness,
wherein the jig body includes:
a central area, to which a cleaning liquid is supplied from a nozzle unit; and
an edge area surrounding the central area,
wherein spattering guide grooved formed in the edge area to be recessed such that the cleaning liquid spatters with a centrifugal force due to rotation of the spin head
wherein the spattering guide grooves are formed on an upper surface of the cleaning jig,
wherein the spattering guide grooves are directly exposed to a treatment space when the cleaning jig is seated on the spin head,
wherein each of the spattering guide grooves is configured such that a first bottom surface thereof in a direction, in which the cleaning liquid spatters, with reference to a bottom point of a bottom surface thereof, a height of which is lowest, is gentler than an inclination of a second bottom surface in an opposite direction.

* * * * *